(12) United States Patent
Tamura et al.

(10) Patent No.: US 9,099,906 B2
(45) Date of Patent: Aug. 4, 2015

(54) INVERTER

(75) Inventors: Shizuri Tamura, Tokyo (JP); Mitsuhiko Kanda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/808,171

(22) PCT Filed: Jul. 6, 2010

(86) PCT No.: PCT/JP2010/061474
§ 371 (c)(1),
(2), (4) Date: Jan. 3, 2013

(87) PCT Pub. No.: WO2012/004860
PCT Pub. Date: Jan. 12, 2012

(65) Prior Publication Data
US 2013/0106255 A1 May 2, 2013

(51) Int. Cl.
*H02K 11/00* (2006.01)
*H02M 5/458* (2006.01)
*H02P 27/06* (2006.01)
*H02M 7/00* (2006.01)
*H02M 1/12* (2006.01)

(52) U.S. Cl.
CPC .......... *H02K 11/0073* (2013.01); *H02M 1/126* (2013.01); *H02M 5/458* (2013.01); *H02M 7/003* (2013.01); *H02P 27/06* (2013.01); *H01L 2224/16225* (2013.01); *H01L 2224/32225* (2013.01); *H01L 2224/48227* (2013.01); *H01L 2224/73265* (2013.01); *H01L 2924/1033* (2013.01); *H01L 2924/10253* (2013.01); *H01L 2924/10272* (2013.01); *H01L 2924/10329* (2013.01); *H01L 2924/1305* (2013.01); *H01L 2924/13055* (2013.01); *H02M 2001/123* (2013.01)

(58) Field of Classification Search
CPC .................................... H02K 11/0073
USPC .......... 310/68 D, 68 R, 68 C, 71, 89
See application file for complete search history.

(56) References Cited

U.S. PATENT DOCUMENTS

| 4,963,778 | A | * | 10/1990 | Jensen et al. ............. 310/68 D |
| 6,078,122 | A | * | 6/2000 | Tang et al. .............. 310/165 |
| 6,541,838 | B1 | | 4/2003 | Suetsugu et al. |

(Continued)

FOREIGN PATENT DOCUMENTS

| CN | 1326262 A | 12/2001 |
| JP | 63-161843 A | 7/1988 |

(Continued)

OTHER PUBLICATIONS

JPO website English translation of JP 2008295126 A, Dec. 2008, Japan, Nishizawa et al., all pages.*

(Continued)

*Primary Examiner* — Naishadh Desai
(74) *Attorney, Agent, or Firm* — Sughrue Mion, PLLC (57) ABSTRACT

An inverter that drives a motor and a noise filter are arranged on a surface of a motor housing, and the inverter and the noise filter are integrated with the motor housing. The noise filter reduces a common-mode current generated by a switching operation of the inverter to flow out to a side of a three-phase power supply through the motor housing.

7 Claims, 6 Drawing Sheets

(56) References Cited

U.S. PATENT DOCUMENTS

| | | | |
|---|---|---|---|
| 6,583,682 | B1 | 6/2003 | Dubhashi et al. |
| 7,207,187 | B2 * | 4/2007 | Funahashi et al. ........... 62/228.4 |
| 7,516,823 | B2 | 4/2009 | Kikuchi et al. |
| 7,608,950 | B2 * | 10/2009 | Brauer ..................... 310/68 R |
| 7,911,093 | B2 * | 3/2011 | Schueren .................. 310/68 R |
| 2005/0223727 | A1 * | 10/2005 | Funahashi et al. ........... 62/228.4 |
| 2006/0064998 | A1 | 3/2006 | Funahashi et al. |
| 2006/0113850 | A1 * | 6/2006 | Togashi ...................... 310/51 |
| 2007/0103951 | A1 | 5/2007 | Ishikawa et al. |
| 2008/0180000 | A1 * | 7/2008 | Ward et al. ................. 310/68 R |
| 2008/0231127 | A1 * | 9/2008 | Lacaze ...................... 310/71 |

FOREIGN PATENT DOCUMENTS

| | | | | |
|---|---|---|---|---|
| JP | 01060267 A | * | 3/1989 | ............ H02M 7/48 |
| JP | 04251557 A | * | 7/1992 | |
| JP | 06077756 A | * | 3/1994 | ............ H03H 7/09 |
| JP | 11-225485 A | | 8/1999 | |
| JP | 2000-315929 A | | 11/2000 | |
| JP | 2001-8495 A | | 1/2001 | |
| JP | 2001-346384 A | | 12/2001 | |
| JP | 2003230273 A | * | 8/2003 | ............ H02M 3/28 |
| JP | 2003-324903 A | | 11/2003 | |
| JP | 2007-37232 A | | 2/2007 | |
| JP | 2007-135252 A | | 5/2007 | |
| JP | 2007135252 A | * | 5/2007 | |
| JP | 2007-325341 A | | 12/2007 | |
| JP | 2008-238987 A | | 10/2008 | |
| JP | 2008-295126 A | | 12/2008 | |
| JP | 2008295126 A | * | 12/2008 | |
| JP | 2009-194957 A | | 8/2009 | |
| JP | 2010-93202 A | | 4/2010 | |

OTHER PUBLICATIONS

JPO website translation of JP 2008-295126, Nishizawa et al., power converter system, Apr. 12, 2008, all pages.*

International Search Report for PCT/JP2010/061474 dated Oct. 5, 2010.

Chinese Office Action, issued Oct. 10, 2013, in Application No. 201080067903.1.

Chinese Office Action issued May 20, 2014 in Chinese Patent Application No. 201080067903.1.

Communication dated Nov. 26, 2014 from the State Intellectual Property Office of the People's Republic of China in counterpart Chinese Patent Application No. 201080067903.1.

* cited by examiner

FIG.9 and an inverter integrated with a motor housing.

INVERTER

CROSS REFERENCE TO RELATED APPLICATIONS

This application is a National Stage of International Application No. PCT/JP2010/061474 filed Jul. 6, 2010, the contents of which are incorporated herein by reference in their entirety.

FIELD

The present invention relates to an inverter, and to an inverter integrated with a motor housing.

BACKGROUND

When a motor is used in a limited installation space such as in a vehicle, an inverter that performs a driving control of the motor is integrated with a motor housing in order to reduce the installation space. In this case, a stray capacitance exists between the motor housing, and a pattern and a wire that are at the same potential as a connection point between upper and lower arms of the inverter. Meanwhile, in the pattern and the wire that are at the same potential as the connection point between the upper and lower arms of the inverter, the potential varies between a DC potential and 0 volt at a high speed. Therefore, when the motor housing is connected to a power-supply ground, a common-mode current flows to a power supply of the inverter and causes noise to occur in other devices connected to the same power system.

To prevent such noise from adversely affecting other devices, there is a common procedure to provide a noise filter on an AC side or a DC side of an inverter, thereby forming a shortcut path for returning a common-mode current to an inverter side to prevent the common-mode current from flowing out to a power supply.

Patent Literature 1 discloses a technique in which a power switching element and a smoothing capacitor that are fixed to an outer peripheral surface of a peripheral wall of a motor housing and a control circuit mounted on a printed circuit board or the like eventually fixed to the motor housing are wired and connected by a bus-bar built-in plate and outer frame part serving as a wiring part.

In addition, Patent Literature 2 discloses a technique in which a power module includes a wide-bandgap power semiconductor switching element, the power module and a power-module drive circuit are accommodated in separate housings, and the housing having the power module accommodated therein is fixed to a housing of a transmission, an engine, or a motor in order to cool the power module.

CITATION LIST

Patent Literatures

Patent Literature 1: Japanese Patent Application Laid-open No. 2003-324903
Patent Literature 2: Japanese Patent Application Laid-open No. 2007-135252

SUMMARY

Technical Problem

However, according to the above conventional technique, a noise filter is arranged separately from a motor housing, and a cable is used for connecting the noise filter and the motor housing. Therefore, there is a problem in that an installation space is increased when the noise filter is provided.

There is also a problem in that when a cable is used for connecting the noise filter and the motor housing, an impedance of the cable interferes with a shortcut path for a common-mode current, and consequently the common-mode current tends to flow out to a power supply.

According to the above conventional technique, when an inverter is integrated with a motor housing, the inverter mounted on a base substrate is mounted on the motor housing through grease or the like. Therefore, there is a problem in that the size of the base substrate needs to be increased in order to efficiently radiate heat generated from the inverter, and accordingly an installation space is increased.

The present invention has been made to solve the above problems, and an object of the present invention is to provide an inverter that can be integrated with a motor housing while reducing an installation space.

Solution to Problem

An inverter according to an aspect of the present invention is integrated with a motor housing, including a noise filter that is integrated with the motor housing and reduces a common-mode current, which is generated by a switching operation of the inverter, to flow out through the motor housing.

Advantageous Effects of Invention

According to the present invention, it is possible to provide an inverter that can be integrated with a motor housing while reducing an installation space.

DESCRIPTION OF EMBODIMENTS

Exemplary embodiments of an inverter according to the present invention will be explained below in detail with reference to the accompanying drawings. The present invention is not limited to the embodiments.

First Embodiment

FIG. 1(a) is a schematic diagram of a mounting state of an inverter according to a first embodiment of the present invention, and FIG. 1(b) is a circuit diagram of a schematic configuration of the inverter in FIG. 1(a). In FIG. 1(a), a motor 3 includes a stator winding E and a motor housing 9, and the stator winding E is accommodated in the motor housing 9. An inverter 2 that drives the motor 3 and a noise filter 8 are arranged on a surface of the motor housing 9, and the inverter 2 and the noise filter 8 are integrated with the motor housing 9. The noise filter 8 can reduce flowing-out of a common-mode current to a side of a three-phase power supply 1 through the motor housing 9. The common-mode current is generated by a switching operation of the inverter 2.

As shown in FIG. 1(b), the inverter 2 includes a converter unit 4 that converts an alternating current into a direct current and an inverter unit 5 that converts a direct current into an alternating current with a variable-frequency.

The converter unit 4 includes a rectification unit 6 that rectifies an alternating current and a smoothing unit 7 that smoothes a rectified current. The rectification unit 6 includes rectifying diodes D1 to D6, where the rectifying diodes 11 and D2 are connected to each other in series, the rectifying diodes D3 and D4 are connected to each other in series, and the rectifying diodes D5 and D6 are connected to each other in series. A connection point A1 between the rectifying diodes D1 and D2, a connection point A2 between the rectifying diodes D3 and D4, and a connection point A3 between the rectifying diodes D5 and D6 are connected to the three-phase power supply 1. The smoothing unit 7 includes a smoothing capacitor C1 and the smoothing capacitor C1 is connected to the rectification unit 6 in parallel.

The inverter unit 5 includes switching elements M1 to M6 and freewheeling diodes N1 to N6. An IGBT, a bipolar transistor, or a field-effect transistor can be used as the switching elements M1 to M6. In this example, the freewheeling diodes N1 to N6 are connected respectively to the switching elements M1 to M6 in parallel. The switching elements M1 and M2 are connected to each other in series, the switching elements M3 and M4 are connected to each other in series, and the switching elements M5 and M6 are connected to each other in series.

A connection point between the switching elements M1 and M2, a connection point between the switching elements M3 and M4, and a connection point between the switching elements M5 and M6 are connected to the motor 3. The switching elements M1, M3, and M5 can compose upper arms respectively for the three phases of the inverter 2, and the switching elements M2, M4, and M6 can compose lower arms respectively for the three phases of the inverter 2.

The noise filter 8 is connected to a connection point between the rectifying diodes D1 and D2, a connection point between the rectifying diodes D3 and D4, and a connection point between the rectifying diodes D5 and D6.

When an alternating current is input from the three-phase power supply 1 to the converter unit 4, the alternating current is converted into a direct current in the converter unit 4, and the direct current is input to the inverter unit 5. In the inverter unit 5, the direct current is converted into an alternating current according to a switching operation of the switching elements M1 to M6. As the alternating current is supplied to the motor 3, the motor 3 is driven by a PWM control.

A common line between the cathode side of the rectifying diodes D1, D3, and D5 and the freewheeling diodes N1, N3, and N5 and collectors of the switching elements M1, M3, and M5 is referred to as "P", and a common line between the anode side of the rectifying diodes D2, D4, and D6 and the freewheeling diodes N2, N4, and N6 and emitters of the switching elements M2, M4, and M6 is referred to as "N". The potential in the line P is charged to the smoothing capacitor C1 as a DC voltage with respect to a reference potential in the line N. When the switching elements M1 to M6 perform a switching operation, in a pattern and a wire that are at the same potential as a connection point between the upper and lower arms of the inverter 2, the potential varies between the potential P and the potential N at a high speed, and a common-mode current is generated from the inverter 2. Meanwhile, when the inverter 2 is integrated with the motor housing 9, a stray capacitance exists between the motor housing 9, and the pattern and the wire that are at the same potential as the connection point between the upper and lower arms of the inverter 2. Therefore, the common-mode current generated from the inverter 2 is transmitted to the motor housing 9 through the stray capacitance.

When the motor housing 9 is grounded, a shortcut path for returning the common-mode current, which is transmitted to the motor housing 9, to a side of the inverter 2 is formed in the noise filter 8. Therefore, the common-mode current transmitted to the motor housing 9 is returned to the side of the inverter 2 through the noise filter 8, and the common-mode current is suppressed from flowing out to the side of the three-phase power supply 1. As a result, even when a common-mode current is generated from the inverter 2, noise caused by the common-mode current to occur in other devices connected to the same power system as the three-phase power supply 1 is suppressed.

Because the noise filter 8 is integrated with the motor housing 9, it becomes unnecessary to use a cable for connecting the noise filter 8 and the motor housing 9. Accordingly, reduction of an installation space can be realized while it can be prevented that a cable impedance interferes with the shortcut path for a common-mode current. This configuration makes it possible that the common-mode current is difficult to flow out to the side of the three-phase power supply 1.

Second Embodiment

Figure 2:
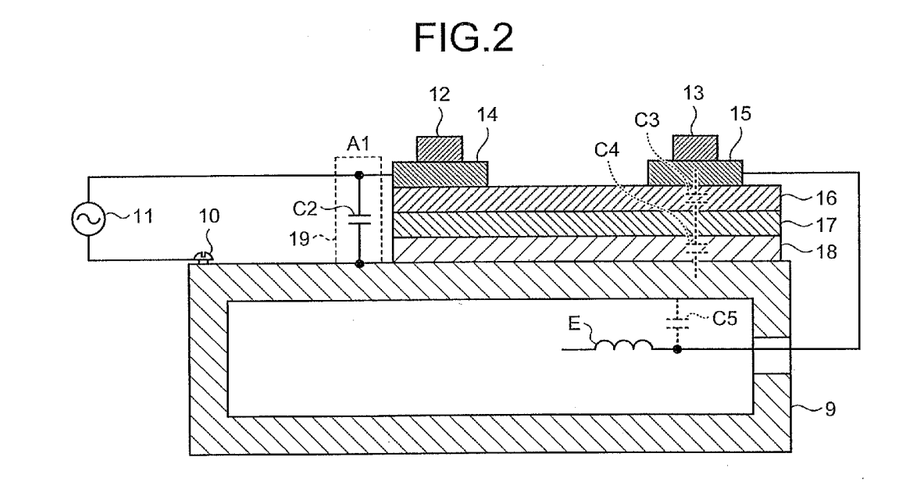
FIG. 2 is a cross-sectional view of a schematic configuration of one phase of an inverter according to a second embodiment of the present invention.

FIG. 2 is a cross-sectional view of a schematic configuration of one phase of an inverter according to a second embodiment of the present invention. In FIG. 2, an insulating layer 16 is formed on a base substrate 17, and conductor patterns 14 and 15 are formed on the insulating layer 16. A diode chip 12 is mounted on the insulating layer 16 through the conductor pattern 14, and a semiconductor chip 13 is mounted on the insulating layer 16 through the conductor pattern 15. The base substrate 17 is fixed to the motor housing 9 through an adhesive layer 18, thereby being integrated with the motor housing 9.

Figure 1:
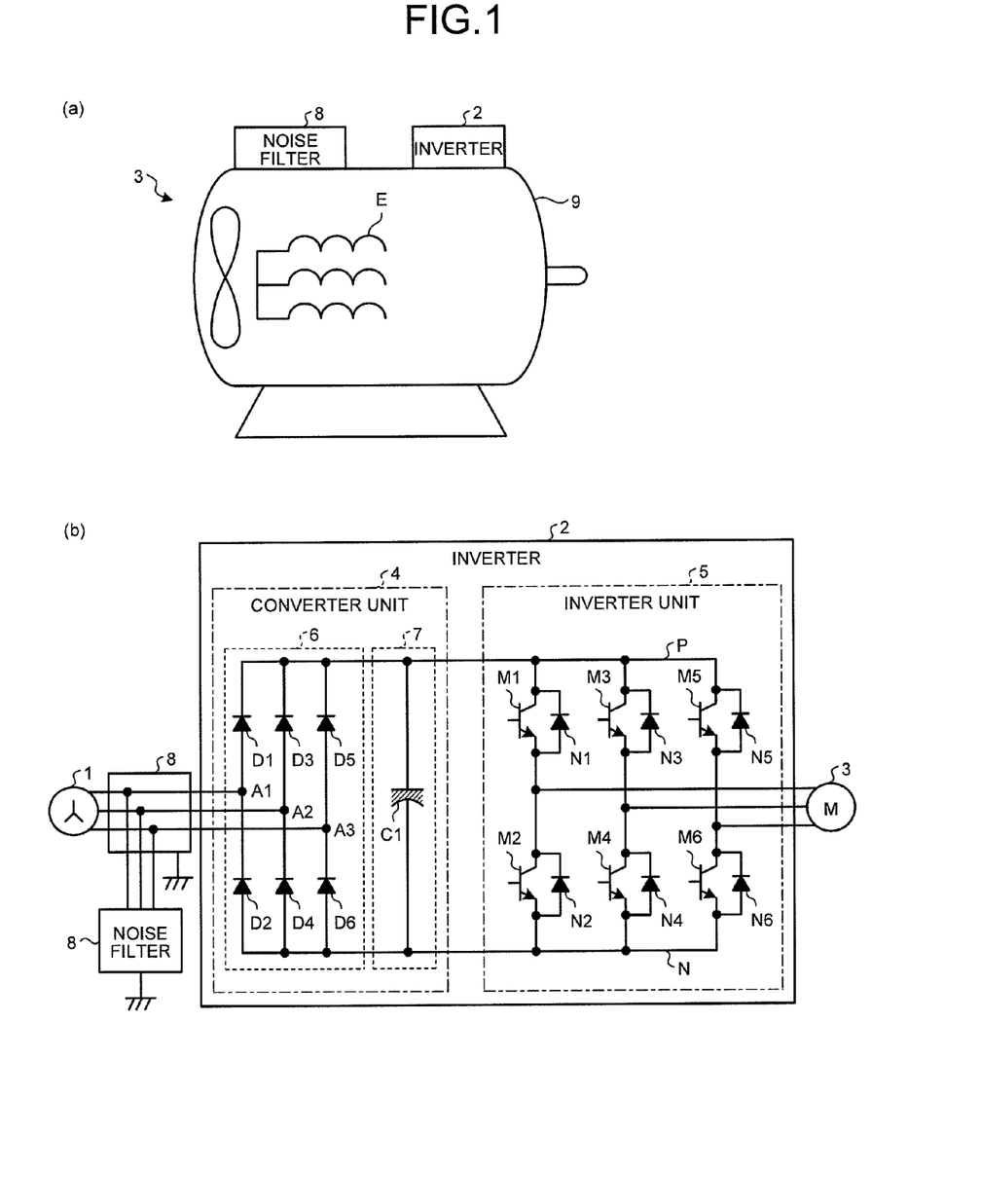
FIG. 1(a) is a schematic diagram of a mounting state of an inverter according to a first embodiment of the present invention.
FIG. 1(b) is a circuit diagram of a schematic configuration of the inverter in FIG. 1(a).

The rectifying diodes D1 to 06 shown in FIG. 1 can be formed in the diode chip 12. The switching elements M1 to M6 and the freewheeling diodes N1 to N6 shown in FIG. 1 can be formed in the semiconductor chip 13. A semiconductor such as Si or GaAs or a wide bandgap semiconductor such as SiC, GaN, or diamond can be used as the material of the semiconductor chip 13. In addition, a material having high heat-radiation properties such as Cu or Al can be used as the material of the base substrate 17. An inorganic film such as a silicon oxide film or a silicon nitride film, a resin substrate such as a glass-epoxy substrate, a film substrate made of polyimide or the like, and a ceramic substrate or the like can be used as the insulating layer 16. Grease or epoxy resin, silicon resin, or other resin can be used as the adhesive layer 18. Metal having a high conductivity such as Cu or Al can be used as the material of the conductor patterns 14 and 15. Metal such as iron and stainless can be used as the material of the motor housing 9.

A ground terminal 10 is provided on the motor housing 9 and the motor housing 9 is connected to a power-supply ground. The conductor pattern 14 is connected to an AC power supply 11, and the conductor pattern 15 is connected to the stator winding E.

An AC filter 19 is arranged on the surface of the motor housing 9 and is integrated with the motor housing 9. In the present embodiment, the AC filter 19 includes a capacitor C2. One terminal of the capacitor C2 is directly connected to the motor housing 9, and the other terminal of the capacitor C2 is connected to the conductor pattern 14.

A stray capacitance C3 is formed between the conductor pattern 15 and the base substrate 17, a stray capacitance C4 is formed between the base substrate 17 and the motor housing 9, and a stray capacitance C5 is formed between the motor housing 9 and the stator winding E.

When the switching elements M1 to M6 perform a switching operation, in a pattern and a wire that are at the same potential as a connection point between upper and lower arms of the semiconductor chip 13, the potential varies at a high speed, and a common-mode current is generated from the semiconductor chip 13. The common-mode current generated from the semiconductor chip 13 is transmitted to the motor housing 9 through the stray capacitances C3 to C5 and is returned to the conductor pattern 14 through the capacitor C2. With this configuration, the common-mode current transmitted to the motor housing 9 is suppressed from flowing out to a side of the AC power supply 11 through the ground terminal 10, and noise caused by the common-mode current to occur in other devices connected to the same power system as the AC power supply 11 is suppressed.

As the AC filter 19 is integrated with the motor housing 9, it becomes unnecessary to use a cable for connecting the AC filter 19 and the motor housing 9. Accordingly, reduction of an installation space can be realized while it can be prevented that a cable impedance interferes with a shortcut path for a common-mode current. This configuration makes it possible that the common-mode current is difficult to flow out to the side of the AC power supply 11.

Third Embodiment

Figure 3:
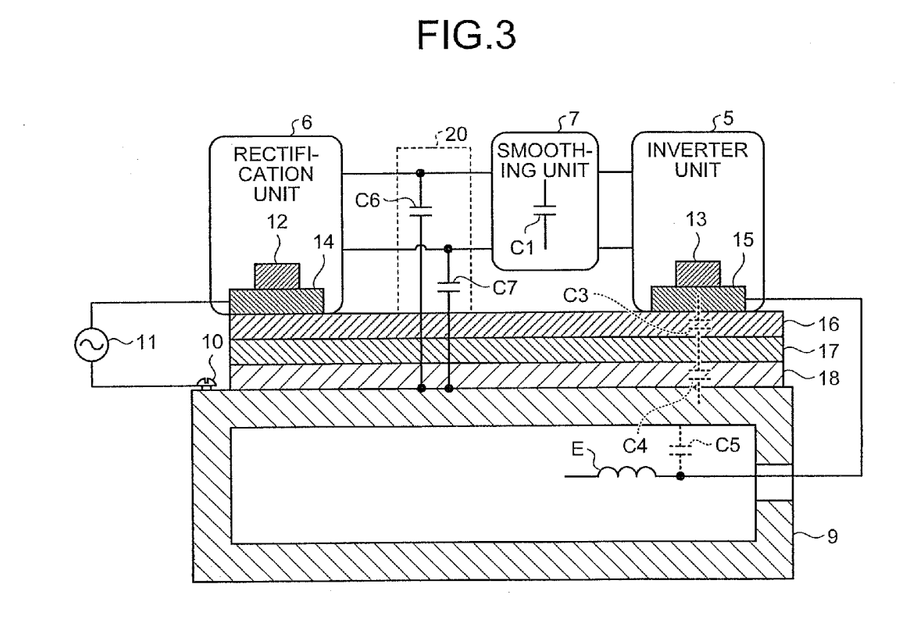
FIG. 3 is a cross-sectional view of a schematic configuration of one phase of an inverter according to a third embodiment of the present invention.

FIG. 3 is a cross-sectional view of a schematic configuration of one phase of an inverter according to a third embodiment of the present invention. In FIG. 3, the insulating layer 16 is formed on the base substrate 17, and the conductor patterns 14 and 15 are formed on the insulating layer 16. The rectification unit 6, the smoothing unit 7, and the inverter unit 5 are arranged on the insulating layer 16. In the present embodiment, the rectification unit 6 includes the diode chip 12, and the inverter unit 5 includes the semiconductor chip 13. The diode chip 12 is mounted on the insulating layer 16 through the conductor pattern 14, and the semiconductor chip 13 is mounted on the insulating layer 16 through the conductor pattern 15. The base substrate 17 is fixed to the motor housing 9 through the adhesive layer 18, thereby being integrated with the motor housing 9.

A DC filter 20 is arranged on the surface of the motor housing 9 and is integrated with the motor housing 9. In the present embodiment, the DC filter 20 includes capacitors C6 and C7. One terminal of the capacitor C6 is directly connected to the motor housing 9, and the other terminal of the capacitor C6 is connected to one end of the smoothing capacitor C1. One terminal of the capacitor C7 is directly connected to the motor housing 9, and the other terminal of the capacitor C7 is connected to the other end of the smoothing capacitor C1.

When the switching elements M1 to M6 perform a switching operation, in a pattern and a wire that are at the same potential as a connection point between upper and lower arms of the semiconductor chip 13, the potential varies at a high speed, and a common-mode current is generated from the semiconductor chip 13. The common-mode current generated from the semiconductor chip 13 is transmitted to the motor housing 9 through the stray capacitances C3 to C5 and is returned to the smoothing capacitor C1 through the capacitors C6 and C7. With this configuration, the common-mode current transmitted to the motor housing 9 is suppressed from flowing out to the side of the AC power supply 11 through the ground terminal 10, and noise caused by the common-mode current to occur in other devices connected to the same power system as the AC power supply 11 is suppressed.

Because the DC filter 20 is integrated with the motor housing 9, it becomes unnecessary to use a cable for connecting the DC filter 20 and the motor housing 9. Accordingly, reduction of an installation space can be realized while it can be prevented that a cable impedance interferes with a shortcut path for a common-mode current. This configuration makes it possible that the common-mode current is difficult to flow out to the side of the AC power supply 11.

Fourth Embodiment

Figure 4:
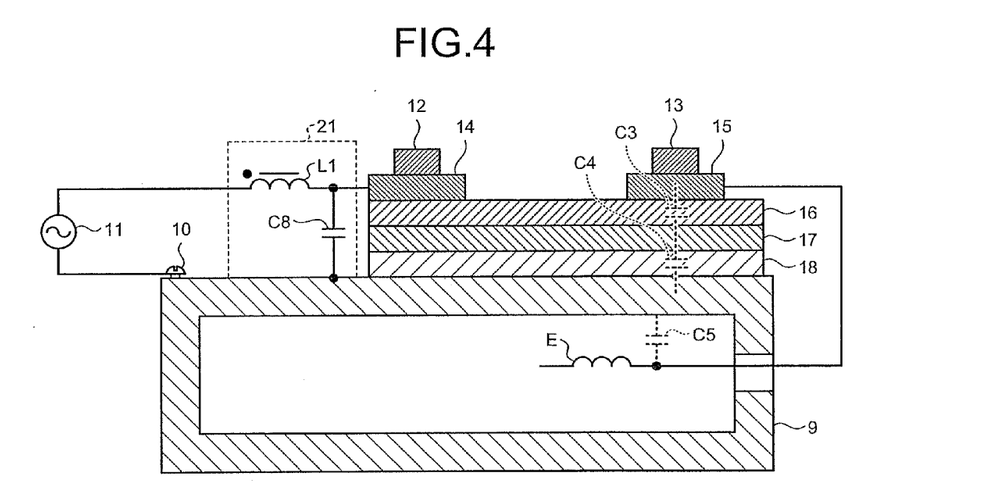
FIG. 4 is a cross-sectional view of a schematic configuration of one phase of an inverter according to a fourth embodiment of the present invention.

FIG. 4 is a cross-sectional view of a schematic configuration of one phase of an inverter according to a fourth embodiment of the present invention. In FIG. 4, the inverter includes an AC filter 21 instead of the AC filter 19 in FIG. 2. In the present embodiment, the AC filter 21 includes a capacitor C8 and a reactor L1. One terminal of the capacitor C8 is directly connected to the motor housing 9, and the other terminal of the capacitor C8 is connected to the conductor pattern 14. One terminal of the reactor L1 is connected to the AC power supply 11, and the other terminal of the reactor L1 is connected to the other terminal of the capacitor C8.

When the switching elements M1 to M6 perform a switching operation, in a pattern and a wire that are at the same potential as a connection point between upper and lower arms of the semiconductor chip 13, the potential varies at a high speed, and a common-mode current is generated from the semiconductor chip 13. The common-mode current generated from the semiconductor chip 13 is transmitted to the motor housing 9 through the stray capacitances C3 to C5 and is returned to the conductor pattern 14 through the capacitor C8, while the common-mode current returned to the conductor pattern 14 is suppressed by the reactor L1 from flowing out to the side of the AC power supply 11. With this configuration, the common-mode current transmitted to the motor housing 9 is suppressed from flowing out to the side of the AC power supply 11 through the ground terminal 10 and the capacitor C8, and noise caused by the common-mode current to occur in other devices connected to the same power system as the AC power supply 11 is suppressed. While the reactor L1 is very effective when it is a common-mode choke coil, the reactor L1 is still effective when it is a normal-mode choke coil.

Because the AC filter 21 is integrated with the motor housing 9, it becomes unnecessary to use a cable for connecting the AC filter 21 and the motor housing 9. Accordingly, reduction of an installation space can be realized while it can be prevented that a cable impedance interferes with a shortcut path for a common-mode current. This configuration makes it possible that the common-mode current is difficult to flow out to the side of the AC power supply 11.

Fifth Embodiment

Figure 5:
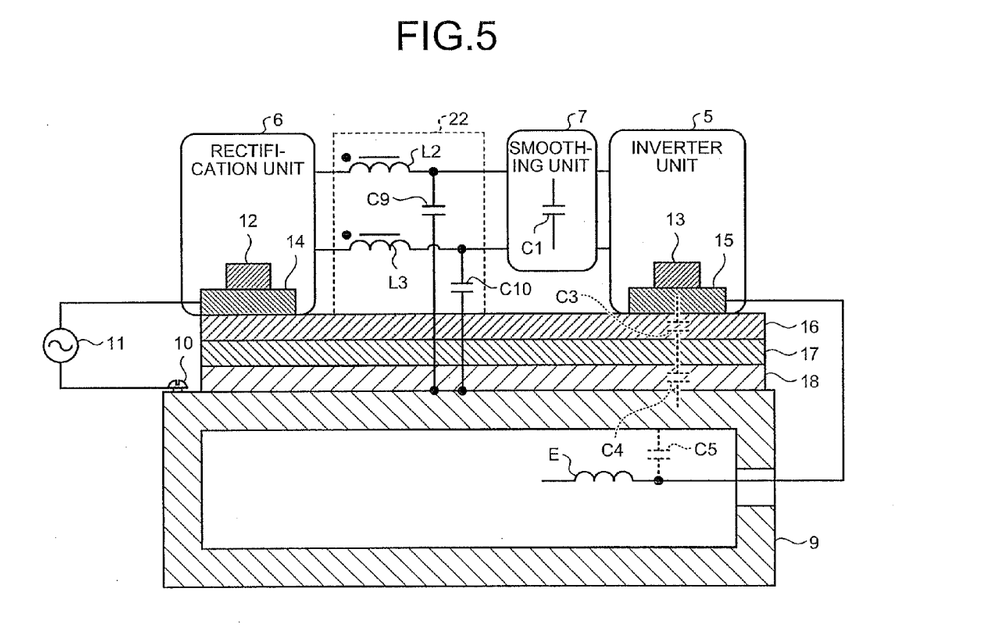
FIG. 5 is a cross-sectional view of a schematic configuration of one phase of an inverter according to a fifth embodiment of the present invention.

FIG. 5 is a cross-sectional view of a schematic configuration of one phase of an inverter according to a fifth embodiment of the present invention. In FIG. 5, the inverter includes a DC filter 22 instead of the DC filter 20 in FIG. 3. In the present embodiment, the DC filter 22 includes capacitors C9 and C10 and reactors L2 and L3. One terminal of the capacitor C9 is directly connected to the motor housing 9, and the other terminal of the capacitor C9 is connected to one end of the smoothing capacitor C1. One terminal of the capacitor C10 is directly connected to the motor housing 9, and the other terminal of the capacitor C10 is connected to the other end of the smoothing capacitor C1. One terminal of the reactor L2 is connected to an anode of the rectifying diode D5, and the other terminal of the reactor L2 is connected to the other terminal of the capacitor C9. One terminal of the reactor L3 is connected to a cathode of the rectifying diode D6, and the other terminal of the reactor L3 is connected to the other terminal of the capacitor C10.

When the switching elements M1 to M6 perform a switching operation, in a pattern and a wire that are at the same potential as a connection point between upper and lower arms of the semiconductor chip 13, the potential varies at a high speed, and a common-mode current is generated from the semiconductor chip 13. The common-mode current generated from the semiconductor chip 13 is transmitted to the motor housing 9 through the stray capacitances C3 to C5 and is returned to the smoothing capacitor C1 through the capacitors C9 and C10, while the common-mode current returned to the smoothing capacitor C1 is suppressed by the reactors L2 and L3 from flowing out to a side of the rectification unit 6. With this configuration, the common-mode current transmitted to the motor housing 9 is suppressed from flowing out to the side of the AC power supply 11 through the ground terminal 10 and the capacitors C9 and C10, and noise caused by the common-mode current to occur in other devices connected to the same power system as the AC power supply 11 is suppressed. While the reactors L2 and L3 are very effective when these are common-mode choke coils, the reactors L2 and L3 are still effective when these are normal-mode choke coils.

Because the DC filter 22 is integrated with the motor housing 9, it becomes unnecessary to use a cable for connecting the DC filter 22 and the motor housing 9. Accordingly, reduction of an installation space can be realized while it can be prevented that a cable impedance interferes with a shortcut path for a common-mode current. This configuration makes it possible that the common-mode current is difficult to flow out to the side of the AC power supply 11.

Sixth Embodiment

Figure 6:
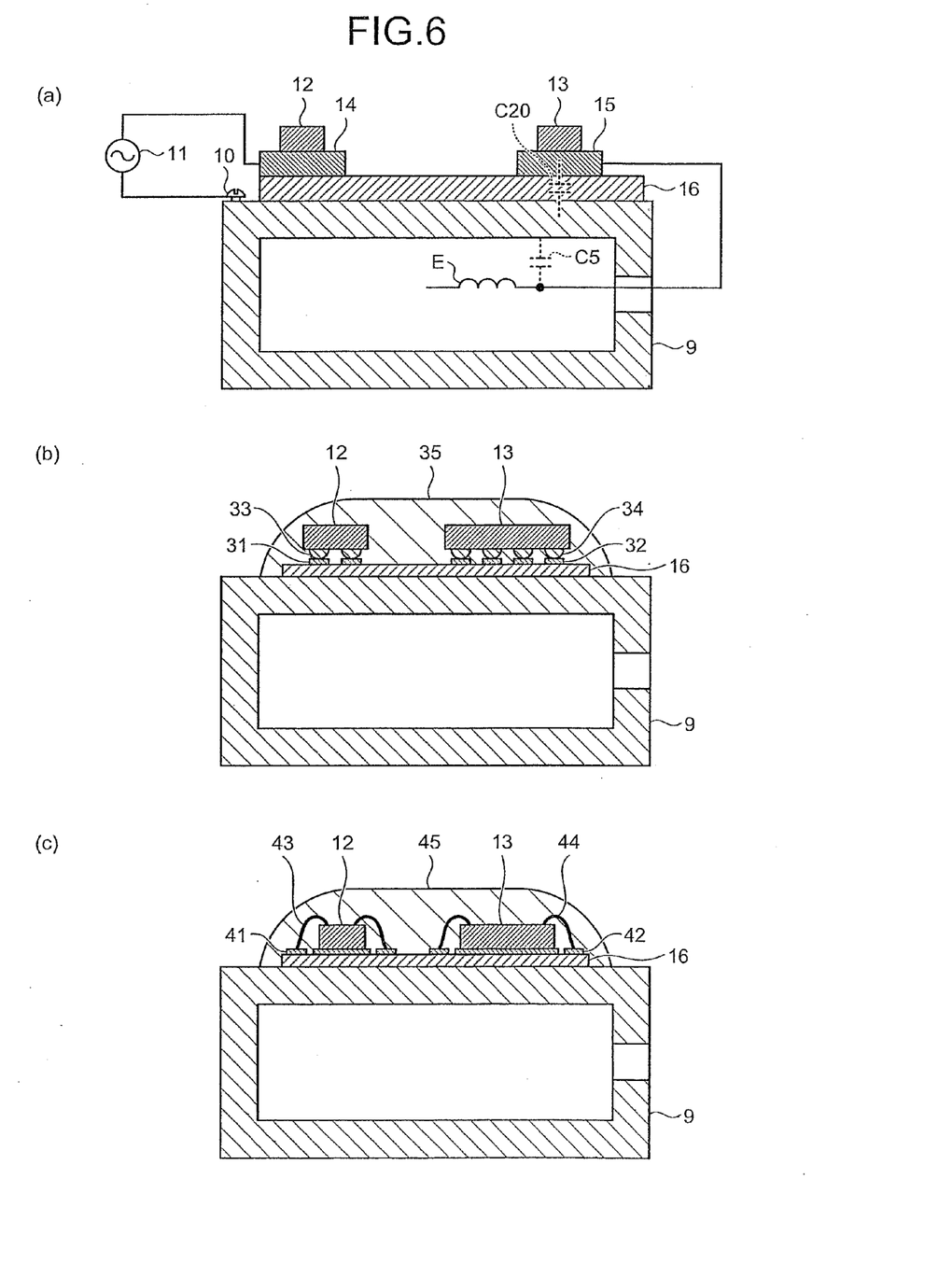
FIG. 6 are cross-sectional views of a schematic configuration of one phase of an inverter according to a sixth embodiment of the present invention.

FIGS. 6 are cross-sectional views of a schematic configuration of one phase of an inverter according to a sixth embodiment of the present invention. In FIG. 6(a), the insulating layer 16 is formed on the surface of the motor housing 9, and the conductor patterns 14 and 15 are formed on the insulating layer 16. The diode chip 12 is mounted on the insulating layer 16 through the conductor pattern 14, and the semiconductor chip 13 is mounted on the insulating layer 16 through the conductor pattern 15, thereby integrating the diode chip 12 and the semiconductor chip 13 in a bare-chip state with the motor housing 9. In addition, a stray capacitance C20 is formed between the conductor pattern 15 and the motor housing 9.

Therefore, heat generated from the inverter 2 can be directly radiated through the motor housing 9, and it becomes unnecessary to use the base substrate 17 for integrating the inverter 2 with the motor housing 9. Accordingly, space saving can be realized while maintaining heat-radiation properties.

As a method of mounting the diode chip 12 and the semiconductor chip 13, face-down mounting can be applied as shown in FIG. 6(b) or face-up mounting can be applied as shown in FIG. 6(c).

Specifically, when the diode chip 12 and the semiconductor chip 13 are face-down mounted as shown in FIG. 6(b), protruding electrodes 33 are formed on the diode chip 12 and protruding electrodes 34 are formed on the semiconductor chip 13. Furthermore, the insulating layer 16 is formed on the surface of the motor housing 9, and conductor patterns 31 and 32 to which the protruding electrodes 33 and 34 are respectively bonded are formed on the insulating layer 16. The diode chip 12 is connected to the conductor pattern 31 through the protruding electrodes 33, and the semiconductor chip 13 is connected to the conductor pattern 32 through the protruding electrodes 34, thereby integrating the diode chip 12 and the semiconductor chip 13 in a bare-chip state with the motor housing 9.

A bump electrode made of Au, Ni, or the like or a solder ball can be used as the protruding electrode 34. Furthermore, the diode chip 12 and the semiconductor chip 13 that are integrated with the motor housing 9 can be sealed by a sealing resin 35. Epoxy resin can be used as the material of the sealing resin 35, for example. Furthermore, a potting method, a screen-printing method or the like can be used as a method of sealing the diode chip 12 and the semiconductor chip 13 by the sealing resin 35.

As a method of forming the insulating layer 16 directly on the surface of the motor housing 9, it is possible to employ a method in which insulating paste is applied on the surface of the motor housing 9 by an inkjet method or the like, and the insulating paste is solidified by a heat-treatment method or the like. As a method of forming the conductor patterns 31 and 32 directly on the insulating layer 16 on the motor housing 9, it is possible to employ a method in which conductive paste is applied on a surface of the insulating layer 16 by an inkjet method or the like, and the conductive paste is solidified by a heat-treatment method or the like.

On the other hand, when the diode chip 12 and the semiconductor chip 13 are face-up mounted, the insulating layer 16 is formed on the surface of the motor housing 9, and conductor patterns 41 and 42 to which bonding wires 43 and 44 are respectively bonded are formed on the insulating layer 16 as shown in FIG. 6(c). The diode chip 12 and the semiconductor chip 13 are then mounted on the insulating layer 16, the diode chip 12 is electrically connected to the conductor pattern 41 through the bonding wire 43, and the semiconductor chip 13 is electrically connected to the conductor pattern 42 through the bonding wire 44. The diode chip 12 and the semiconductor chip 13 that are integrated with the motor housing 9 are sealed together with the bonding wires 43 and 44 by a sealing resin 45.

Seventh Embodiment

Figure 7:
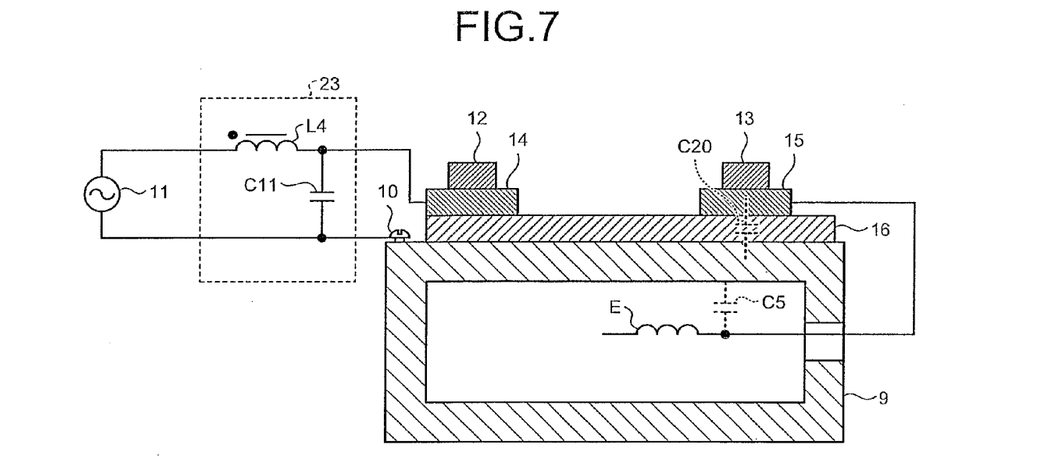
FIG. 7 is a cross-sectional view of a schematic configuration of one phase of an inverter according to a seventh embodiment of the present invention.

FIG. 7 is a cross-sectional view of a schematic configuration of one phase of an inverter according to a seventh embodiment of the present invention. In FIG. 7, the inverter includes an AC filter 23 in addition to the configuration of FIG. 6. The AC filter 23 includes a capacitor C11 and a reactor L4. One terminal of the capacitor C11 is connected to the motor housing 9, and the other terminal of the capacitor C11 is connected to the conductor pattern 14. One terminal of the reactor L4 is connected to the AC power supply 11, and the other terminal of the reactor L4 is connected to the other terminal of the capacitor C11. A cable can be used for connecting the AC filter 23 and the motor housing 9.

With this configuration, the inverter 2 can be integrated with the motor housing 9 without using the base substrate 17, and accordingly space saving can be realized while maintaining heat radiation properties. Also, noise leakage caused by a common-mode current can be suppressed.

Eighth Embodiment

Figure 8:
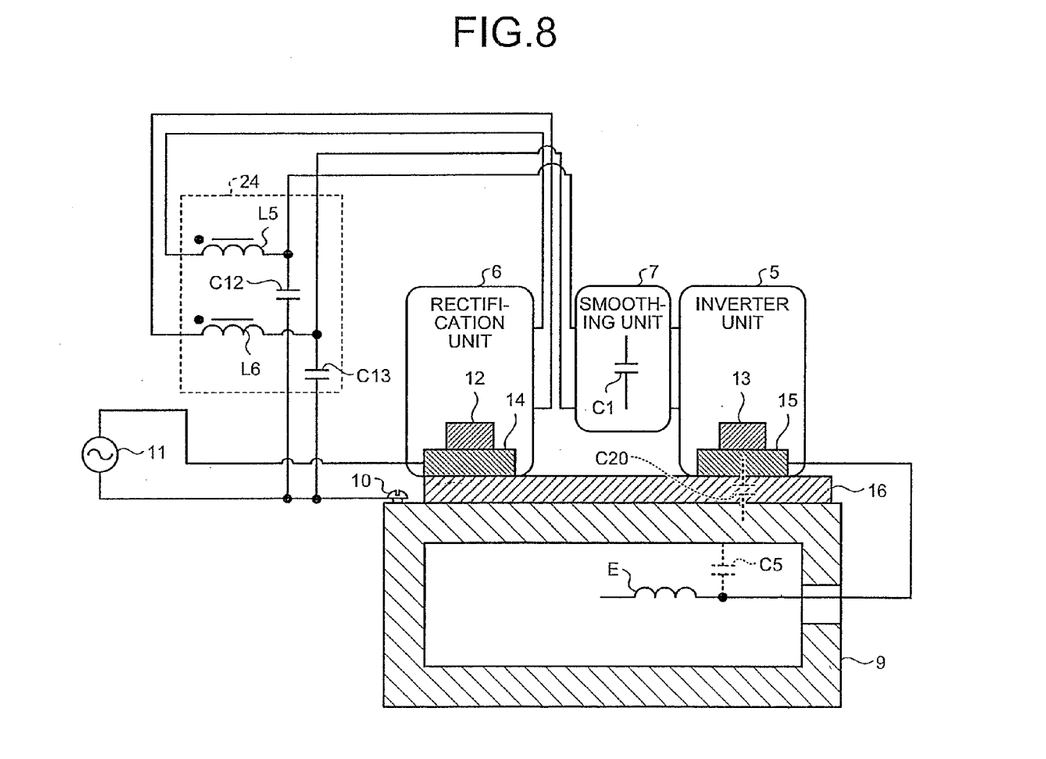
FIG. 8 is a cross-sectional view of a schematic configuration of one phase of an inverter according to an eighth embodiment of the present invention.

FIG. 8 is a cross-sectional view of a schematic configuration of one phase of an inverter according to an eighth embodiment of the present invention. In FIG. 8, the inverter includes a DC filter 24 in addition to the configuration of FIG. 6. The DC filter 24 includes capacitors C12 and C13 and reactors L5 and L6. One terminal of the capacitor C12 is connected to the motor housing 9, and the other terminal of the capacitor C12 is connected to one end of the smoothing capacitor C1. One terminal of the capacitor C13 is connected to the motor housing 9, and the other terminal of the capacitor C13 is connected to the other end of the smoothing capacitor C1. One terminal of the reactor L5 is connected to an anode of the rectifying diode D5, and the other terminal of the reactor L5 is connected to the other terminal of the capacitor C12. One terminal of the reactor L6 is connected to a cathode of the rectifying diode 06, and the other terminal of the reactor L6 is connected to the other terminal of the capacitor C13. A cable can be used for connecting the DC filter 24 and the motor housing 9.

With this configuration, the inverter 2 can be integrated with the motor housing 9 without using the base substrate 17, and accordingly space saving can be realized while maintaining heat radiation properties. Also, noise leakage caused by a common-mode current can be suppressed.

Ninth Embodiment

Figure 9:
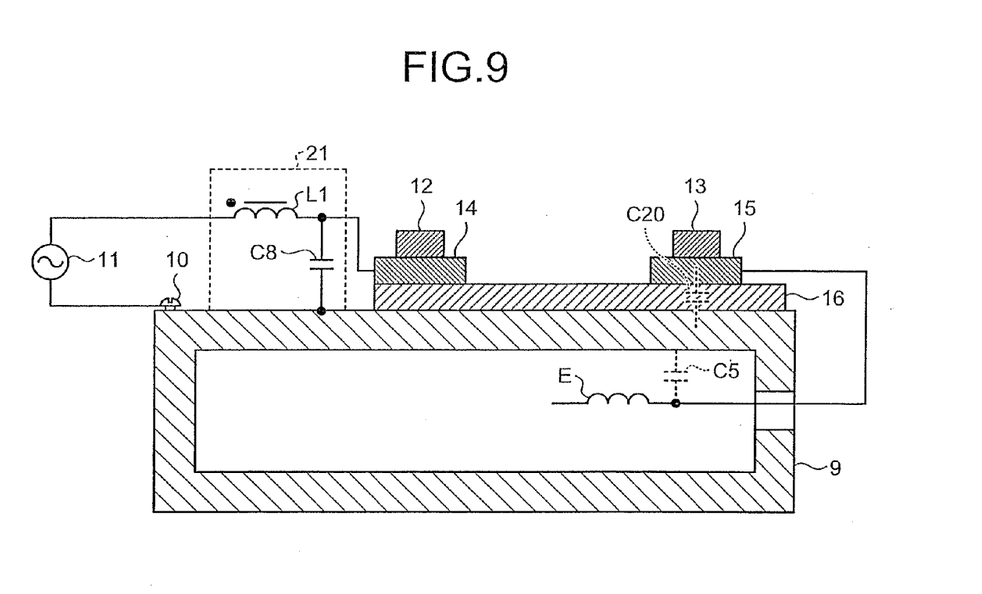
FIG. 9 is a cross-sectional view of a schematic configuration of one phase of an inverter according to a ninth embodiment of the present invention.

FIG. 9 is a cross-sectional view of a schematic configuration of one phase of an inverter according to a ninth embodiment of the present invention. In FIG. 9, the inverter includes the AC filter 21 in addition to the configuration of FIG. 6. The AC filter 21 is arranged on the surface of the motor housing 9, and thus can be integrated with the motor housing 9.

With this configuration, the inverter 2 can be integrated with the motor housing 9 without using the base substrate 17, and accordingly space saving can be realized while maintaining heat radiation properties. Also, noise leakage caused by a common-mode current can be suppressed without using a cable for connecting the AC filter 21 and the motor housing 9.

While a method of integrating the AC filter 21 and the motor housing 9 has been explained in the ninth embodiment shown in FIG. 9, it is also possible to integrate the AC filter 19 and the motor housing 9 shown in FIG. 2, to integrate the DC filter 20 and the motor housing 9 in FIG. 3, or to integrate the DC filter 22 and the motor housing 9. In all the above embodiments, a noise filter for blocking flowing-out of a normal-mode current can be concurrently mounted.

INDUSTRIAL APPLICABILITY

As described above, according to the inverter of the present invention, a noise filter and a motor housing can be integrated with each other, and the inverter is suitable for a method of reducing an installation space of an inverter.

REFERENCE SIGNS LIST 1 three-phase power supply
2 inverter
3 motor
4 converter unit
5 inverter unit
6 rectification unit
7 smoothing unit
8 noise filter
9 motor housing
D1 to D6 rectifying diode
C1 smoothing capacitor
M1 to M6 switching element
N1 to N6 freewheeling diode
E stator winding
10 ground terminal
11 AC power supply
12 diode chip
13 semiconductor chip
14, 15, 31, 32, 41, 42 conductor pattern
16 insulating layer
17 base substrate
18 adhesive layer
19, 21, 23 AC filter
20, 24 DC filter
C2, C6 to C13 capacitor
C3 to C5, C20 stray capacitance
L1 to L6 reactor
33, 34 protruding electrode
43, 44 bonding wire
35, 45 sealing resin

The invention claimed is:

1. A system, comprising,
an inverter; and
a noise filter that reduces an amount of common-mode current, which is generated by a switching operation of the inverter, which flows out through a motor housing to a side of an alternating current power supply,
wherein the inverter and the noise filter are formed on the motor housing,
the motor housing is directly connected to ground without an impedance element between the motor housing and the ground, and a potential of the motor housing is equal to a ground potential, and
the noise filter includes a capacitor in a current path between the motor housing and the inverter,
one terminal of the capacitor is electrically connected to the motor housing, and
another terminal of the capacitor is, in the noise filter, electrically connected to a path formed between an input terminal of the noise filter on the side of the alternating current power supply and an output terminal of the noise filter on a side of the inverter.

2. The system according to claim 1, wherein a shortcut path that returns a common-mode current, which is transmitted to the motor housing, to an inverter side is formed in the noise filter.

3. The system according to claim 1, wherein the noise filter is an AC filter connected to an alternating-current potential side of the inverter.

4. The system according to claim 1, wherein the noise filter is a DC filter connected to a direct-current potential side of the inverter.

5. The system according to claim 1, wherein the noise filter is integrated with the motor housing and includes a reactor that suppresses a common-mode current, which is returned to the inverter side through the capacitor, from flowing out to a power-supply side.

6. The system according to claim 1, wherein a switching element of the inverter is constituted by a wide bandgap semiconductor.

7. The system according to claim 1, wherein a normal-mode noise filter that blocks flowing-out of a normal-mode current is mounted on the inverter.

\* \* \* \* \*